United States Patent
Fukumori

(10) Patent No.: US 9,699,888 B2
(45) Date of Patent: Jul. 4, 2017

(54) CIRCUIT SUBSTRATE AND ELECTRONIC DEVICE

(71) Applicant: FUJITSU LIMITED, Kawasaki-shi, Kanagawa (JP)

(72) Inventor: Taiga Fukumori, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 164 days.

(21) Appl. No.: 14/838,642

(22) Filed: Aug. 28, 2015

(65) Prior Publication Data

US 2016/0105955 A1 Apr. 14, 2016

(30) Foreign Application Priority Data

Oct. 14, 2014 (JP) ................. 2014-210077

(51) Int. Cl.
*H05K 1/11* (2006.01)
*H05K 1/14* (2006.01)
*H05K 1/02* (2006.01)

(52) U.S. Cl.
CPC ......... *H05K 1/0243* (2013.01); *H05K 1/0218* (2013.01); *H05K 1/0251* (2013.01); *H05K 2201/09618* (2013.01); *H05K 2201/09672* (2013.01); *H05K 2201/10674* (2013.01)

(58) Field of Classification Search
CPC .. H05K 1/0218; H05K 1/0243; H05K 1/0251; H05K 2201/09618; H05K 2201/09672; H05K 2201/10674
See application file for complete search history.

(56) References Cited

U.S. PATENT DOCUMENTS

| | | | | |
|---|---|---|---|---|
| 5,966,294 A * | 10/1999 | Harada | ............... | H05K 1/0233 174/250 |
| 5,982,256 A * | 11/1999 | Uchimura | ............... | H01P 1/047 333/239 |
| 6,198,362 B1 * | 3/2001 | Harada | ............... | H05K 1/0231 333/12 |
| 8,595,924 B2 * | 12/2013 | McKinzie, III | ........... | H01P 1/20 29/601 |
| 2002/0140532 A1 | 10/2002 | Koriyama | | |
| 2013/0127669 A1 * | 5/2013 | Han | ..................... | H01Q 9/0485 343/700 MS |
| 2014/0241114 A1 * | 8/2014 | Matsuda | ............... | B06B 1/0622 367/7 |
| 2016/0065168 A1 * | 3/2016 | Kawai | ................. | H01P 1/20345 333/24 R |

FOREIGN PATENT DOCUMENTS

| | | |
|---|---|---|
| JP | 2002-289737 A1 | 10/2002 |
| JP | 2006-351647 A1 | 12/2006 |
| JP | 2011-100871 A1 | 5/2011 |

* cited by examiner

*Primary Examiner* — Yuriy Semenenko
(74) *Attorney, Agent, or Firm* — Kratz, Quintos & Hanson, LLP

(57) ABSTRACT

A circuit substrate includes: a plurality of signal wirings formed at different positions of the circuit substrate in a thickness direction and extending in parallel in the circuit substrate; and ground layers or power supply layers formed at both sides of the circuit substrate in the thickness direction by interposing the plurality of the signal wirings between the ground layers or between the power supply layers, wherein the plurality of signal wirings are electrically coupled with each other by a plurality of conductors formed at an interval narrower than an interval by which a resonance is caused.

6 Claims, 9 Drawing Sheets

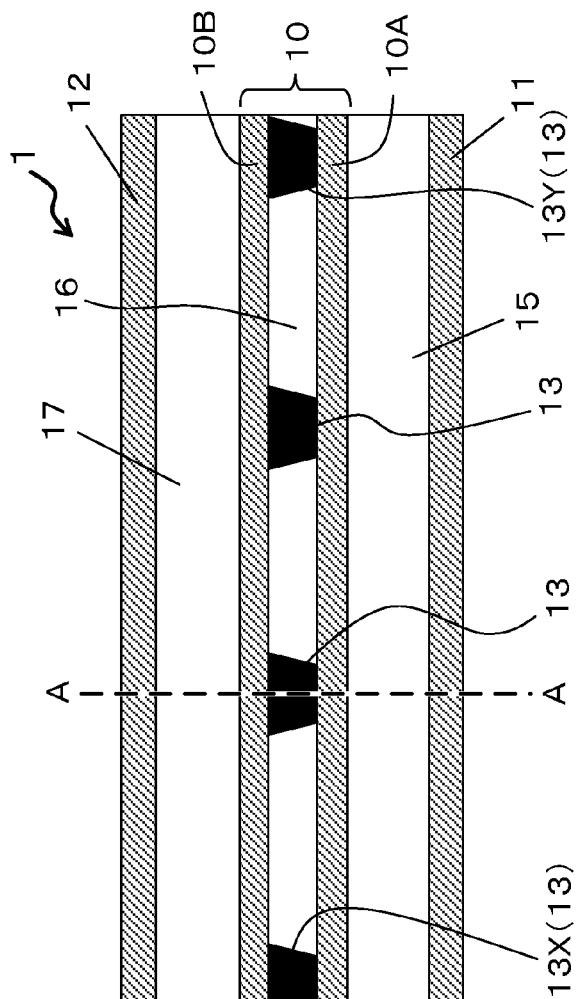
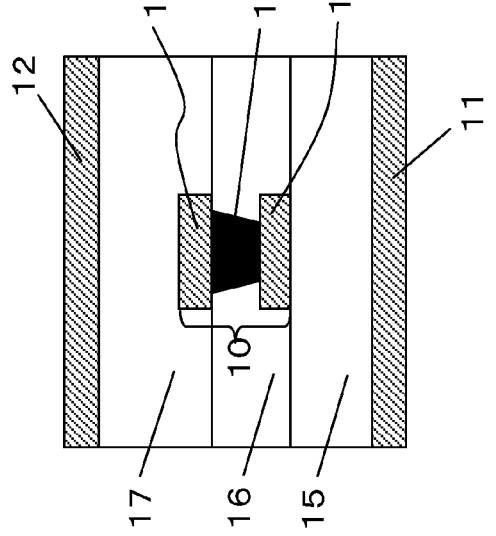
FIG. 1A
FIG. 1B

CIRCUIT SUBSTRATE AND ELECTRONIC DEVICE

CROSS-REFERENCE TO RELATED APPLICATION

This application is based upon and claims the benefit of priority of the prior Japanese Patent Application No. 2014-210077 filed on Oct. 14, 2014, the entire contents of which are incorporated herein by reference.

FIELD

The embodiments discussed herein are related to a circuit substrate and an electronic device.

BACKGROUND

There has been known a package substrate (a circuit substrate) on which a semiconductor chip such as an LSI chip is mounted. When a signal is transmitted at a transmission speed higher than, for example, 1 Gbps in a package substrate, the package substrate is generally adapted to have a strip line structure in which ground layers exist above and below the signal wiring. Further, in order to control the characteristic impedance of the wiring, there is a technology in which a wiring substrate is adapted to include a signal line made of a plurality of parallel conductors and including through hole conductors formed at both ends thereof, and include a power supply layer or a ground layer formed both above and below the signal line.

In the package substrate, the length of the signal wiring is at most about 3 cm (centimeter) long and the signal loss is not so much compared to a system board formed with a signal wiring having a wiring length of tens of centimeters. Therefore, an ability to cope with achieving high density or connection reliability has been important targets to be solved. However, when the signal is transmitted at the transmission speed higher than, for example, 10 Gbps, the signal loss in the package substrate is increased. Therefore, the signal loss in the package substrate is required to be reduced in order to achieve further improvement of the transmission speed.

Further, the development of technology has made it possible to manufacture a large scale semiconductor chip and the length of the signal wiring is increased due to the increase of the package substrate size accompanied by the manufacturing of the large scale semiconductor chip. Also, when the signal wiring length is increased, a signal loss is also increased. From this stand point of view, the reduction of the signal loss in the package substrate is also required. Accordingly, the technology described above may be applied to the package substrate in order to achieve the reduction of the signal loss in the package substrate. That is, the package substrate may be adapted to include a signal line made of a plurality of parallel conductors and including vias formed at both ends thereof, and include a power supply layer or a ground layer formed above and below the signal line.

However, it has been found out that when the signal line is made of a plurality of parallel conductors including vias formed at both ends thereof, a loss occurs due to the resonance depending on an interval between vias (a length of signal line) or a transmission speed (a frequency of transmission signal) and thus, the signal transmission may not be performed. That is, it has been found out that when the transmission speed is increased (either when the frequency of transmission signal becomes higher) or when the signal line length is increased as described above, a loss occurs due to the resonance and thus, the signal transmission may not be performed.

The following are reference documents.
[Document 1] Japanese Laid-Open Patent Publication No. 2006-351647,
[Document 2] Japanese Laid-Open Patent Publication No. 2011-100871, and
[Document 3] Japanese Laid-Open Patent Publication No. 2002-289737.

SUMMARY

According to an aspect of the invention, a circuit substrate includes: a plurality of signal wirings formed at different positions of the circuit substrate in a thickness direction and extending in parallel in the circuit substrate; and ground layers or power supply layers formed at both sides of the circuit substrate in the thickness direction by interposing the plurality of the signal wirings between the ground layers or between the power supply layers, wherein the plurality of signal wirings are electrically coupled with each other by a plurality of conductors formed at an interval narrower than an interval by which a resonance is caused.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A and FIG. 1B are schematic diagrams illustrating a configuration of a circuit substrate according to the present embodiment, specifically, FIG. 1A is a cross-sectional diagram taken along line A-A of FIG. 1B, and FIG. 1B is a cross-sectional diagram taken along a line in a direction along which a signal wiring extends;

DESCRIPTION OF EMBODIMENTS

Figure 2:
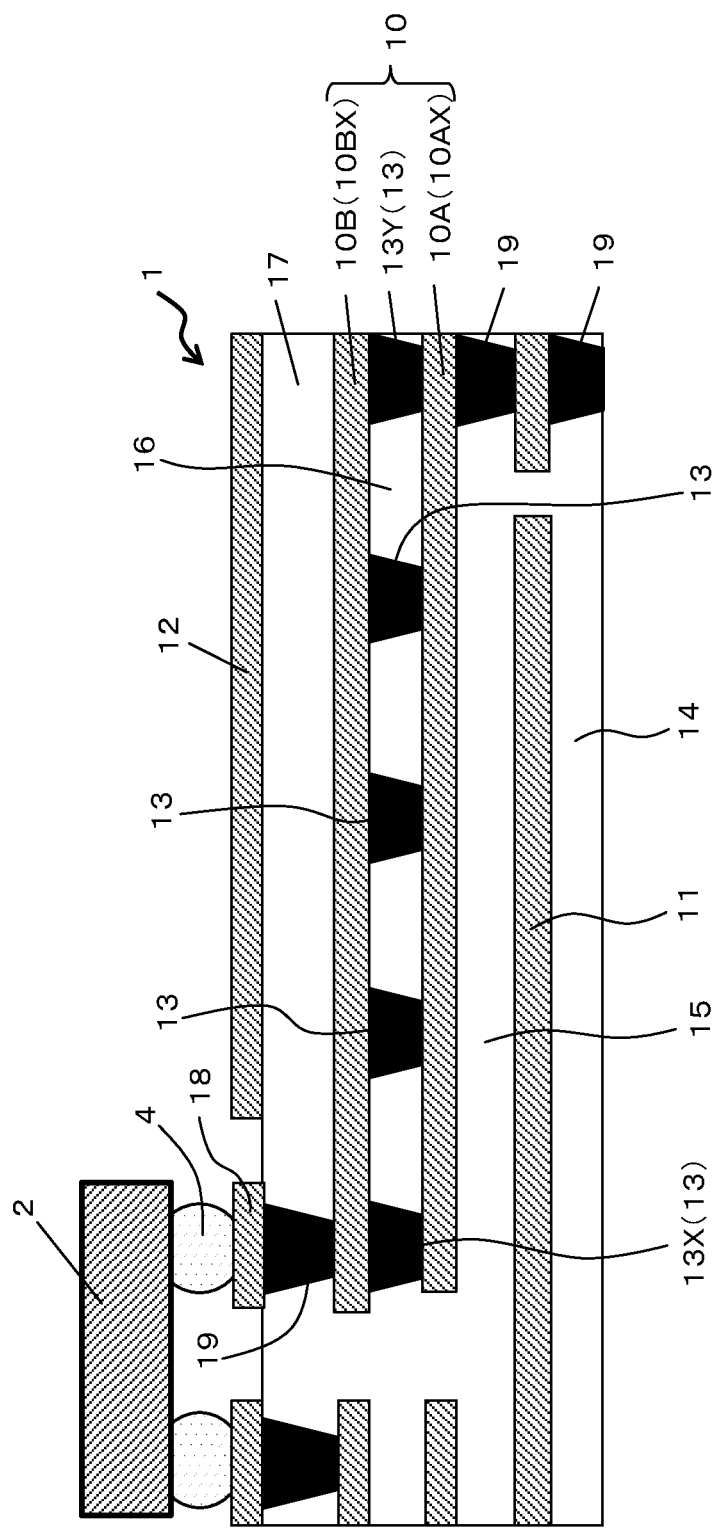
FIG. 2 is a schematic cross-sectional diagram illustrating a specific configuration of the circuit substrate according to the present embodiment.
Figure 3:
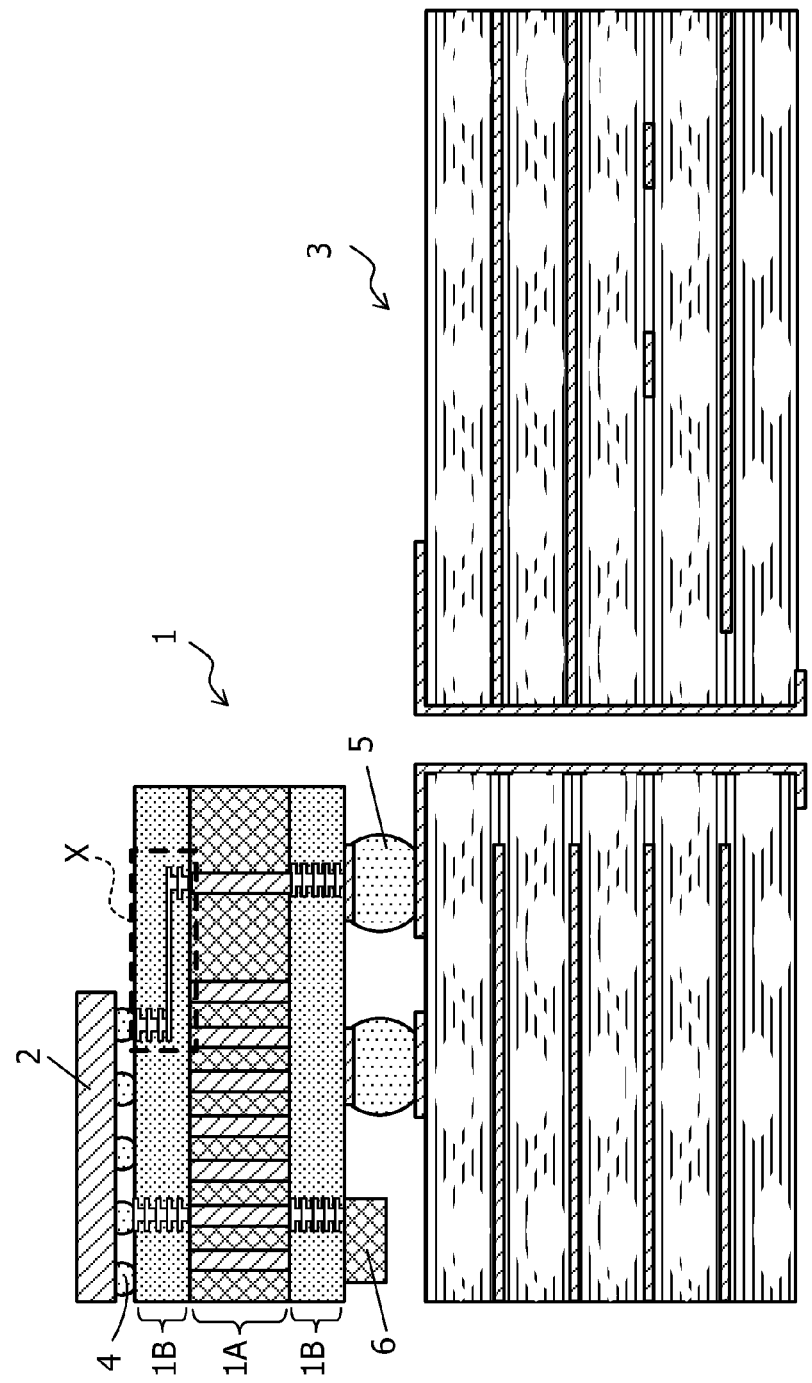
FIG. 3 is a schematic cross-sectional diagram illustrating a configuration of an electronic device according to the present embodiment.

Hereinafter, descriptions will be made on a circuit substrate and an electronic device according to an embodiment of the present disclosure with reference to FIG. 1 to FIG. 9. The electronic device according to the present embodiment includes a circuit substrate 1 and a semiconductor chip 2 electrically connected to the circuit substrate 1, as illustrated in FIG. 3. That is, the electronic device includes the circuit substrate 1 on which the semiconductor chip 2 is mounted.

In the present embodiment, the circuit substrate 1 is a circuit substrate for high frequency such as, for example, a package substrate. Here, the package substrate 1 includes a core part 1A and build-up portions 1B formed on the upper and lower sides of the core part 1A by interposing the core part 1A therebetween. Further, the semiconductor chip 2 is, for example, an LSI chip. Accordingly, the LSI chip 2 is mounted on the package substrate 1 and electrically connected to the package substrate 1 through, for example, a bump 4. The package substrate 1 on which the LSI chip 2 is mounted is mounted on a motherboard 3 (or system board 3) and electrically connected to the motherboard 3 through, for example, a bump 5.

Therefore, the electronic device is adapted to include the motherboard 3, the package substrate 1 which is electrically connected to the motherboard 3, and the LSI chip 2 which is electrically connected to the package substrate 1. Further, the package substrate 1 on which the LSI chip 2 is mounted, that is, a device including the package substrate 1 and the LSI chip 2 electrically connected to the package substrate 1 may be referred to as a semiconductor device. Further, in FIG. 3, a reference number 6 indicates a capacitor. Further, in FIG. 3, since a portion denoted by the reference symbol X is illustrated in FIG. 1 or FIG. 2 in detail, only an outline thereof is illustrated and the details are not illustrated.

In the present embodiment, as illustrated in FIG. 1, the package substrate 1 (here, the build-up portion 1B) as the circuit substrate includes ground layers (or power supply layers) 11, 12 at both sides of a substrate thickness direction by interposing the signal wiring 10. That is, the package substrate 1 of the present embodiment includes a transmission path having a strip line structure in which the ground layers (or the power supply layer) 11, 12 exist above and below the signal wiring 10.

In particular, the signal wiring 10 is constituted by wirings 10A, 10B (here, two wirings) formed at different locations in a substrate thickness direction (a vertical direction) and extend in parallel. The plurality of wirings 10A, 10B are electrically connected with each other by a plurality of vias 13 (conductors) formed at an interval narrower than an interval by which a resonance is caused. Accordingly, an occurrence of loss due to the resonance may be prevented while achieving the reduction of the signal loss in the package substrate 1 even when the length of the signal wiring 10 is increased or the frequency of transmission signal (high frequency signal) becomes higher.

Further, here, the plurality of wirings are electrically connected with each other through the vias, but the connection structure for electrically connecting the plurality of wirings is not limited thereto, and may be configured such that a plurality of wirings are electrically connected using conductors. That is, the plurality of wirings may be electrically connected by a plurality of conductors formed at an interval narrower than an interval by which a resonance is caused.

Specifically, as illustrated in FIG. 2, the package substrate 1 (here, the build-up portion 1B) has a structure in which a first lower insulating layer 14, a lower ground layer 11, a second lower insulating layer 15, a lower wiring layer 10AX (a lower signal layer), an intermediate insulating layer 16, an upper wiring layer 10BX (an upper signal layer), an upper insulating layer 17, and an upper ground layer 12 are laminated. The package substrate 1 has a structure in which conductive layers and insulating layers are alternately laminated and the plurality of laminated conductive layers correspond to the ground layers (or the power supply layers) 11, 12, the lower wiring layer 10AX, and the upper wiring layer 10BX, respectively.

Here, the lower wiring layer 10AX and the upper wiring layer 10BX are wiring layers arranged to be opposed to each other by interposing the intermediate insulating layer 16. Also, the lower wiring layer 10AX is fabricated in a line shape to serve as a linear lower wiring 10A and the upper wiring layer 10BX is fabricated in a line shape to serve as a linear upper wiring 10B. The lower wiring 10A and the upper wiring 10B are arranged to be opposed to each other and extended in parallel by interposing the intermediate insulating layer 16 therebetween. As described above, the signal wiring 10 has a two-layer structure.

Also, the plurality of vias 13 electrically connecting the lower wiring 10A and the upper wiring 10B are formed in the intermediate insulating layer 16 along the direction in which the lower wiring 10A and the upper wiring 10B are extended at an interval narrower than an interval by which a resonance is caused. Here, the plurality of vias 13 are formed in an entire length ranging from one ends of the lower wiring 10A and the upper wiring 10B to the other ends thereof at equal intervals.

As described above, the lower wiring 10A and the upper wiring 10B are electrically connected with each other by the plurality of vias 13 to constitute the signal wiring 10 and the ground layers 11, 12 are formed above and below the signal wiring 10, such that the package substrate 1 is configured to have the strip line structure. In the package substrate 1 having the strip line structure, since the signal wiring 10 is positioned at the inside thereof, both ends of the signal wiring 10 positioned at the inside of the package substrate 1 and, for example, electrode pads 18 of the uppermost surface are electrically connected through the via 19.

The build-up portion 1B of the package substrate 1 may be manufactured by a method, so called a build-up method in which the conductive layer and the insulating layer are sequentially laminated. In this case, the lower wiring 10A and the upper wiring 10B constituting the signal wiring 10 are electrically connected with each other by the via 13 having a height which amounts to the thickness of a single insulating layer. Further, in this case, both ends of the signal wiring 10 and, for example, the electrode pads 18 of the uppermost surface are electrically connected with each other by the vias 13 having a height which amounts to the thickness of a single insulating layer and laminated in the substrate thickness direction.

These vias 13 and 19 may be formed in such a manner that a via hole is formed on a single insulating layer by, for example, laser when sequentially laminating the conductive layer and the insulating layer by, for example, the build-up method, and the via hole is plated. Further, the vias 13 and 19 formed as described above are called a laser via. Further, vias 13X, 13Y that electrically connect both ends of the lower wiring 10A and the upper wiring 10B constituting the signal wiring 10 and the via 19 that electrically connects both ends of the signal wiring 10 and, for example, the electrode pads 18 of the uppermost surface may be formed with the through hole vias formed in the through holes extending from the uppermost surface to the wiring located at a distal end in the substrate thickness direction, respectively.

Further, here, the plurality of vias 13 are formed at an equal interval, but is not limited thereto, and may be formed at different intervals as long as the plurality of vias 13 are formed at an interval narrower than an interval by which the resonance is caused. In the meantime, the plurality of vias 13 may include two vias 13X, 13Y that electrically connect both ends of the plurality of wirings 10A, 10B, respectively.

That is, the plurality of wirings 10A, 10B may be electrically connected in such a manner that both ends of one side and both ends of the other side located at an opposite side thereof in the direction in which the wirings 10A, 10B are electrically connected with each other through the vias 13X, 13Y to constitute a single signal wiring 10. In this case, the plurality of vias 13 are formed in a range from one ends of the plurality of wirings 10A, 10B to the other ends thereof at an interval narrower than an interval by which the resonance is caused. That is, the plurality of vias 13 may be formed in an entire length ranging from one ends of the plurality of wirings 10A, 10B to the other ends thereof at an interval narrower than an interval by which the resonance is caused.

Figure 4:
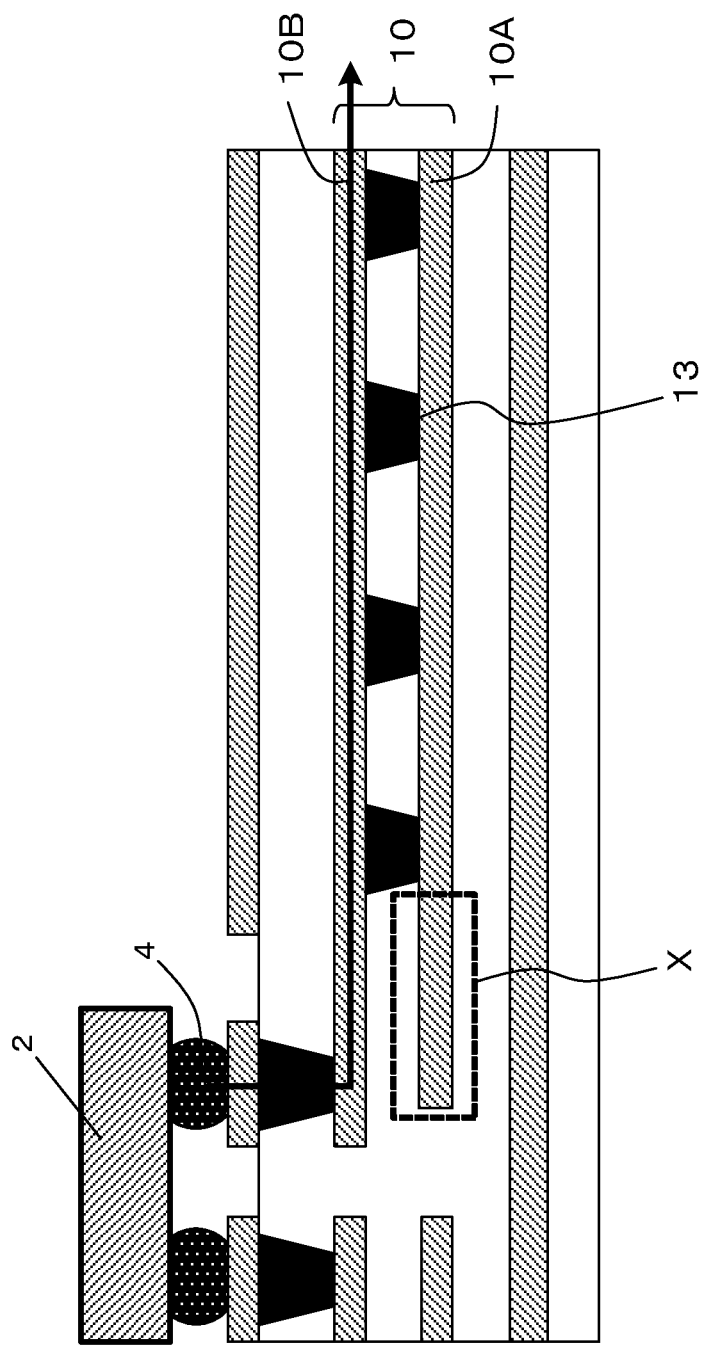
FIG. 4 is a schematic cross-sectional diagram giving an explanation for forming vias at both ends of the signal wiring in the circuit substrate according to the present embodiment.

By doing this, the vias 13X, 13Y that electrically connect the plurality of wirings 10A, 10B may be formed at both ends of the signal wiring 10 so as to prevent wiring (a portion indicated by the reference symbol X in FIG. 4, that is, a conductor or a stub) having a surplus length and branched from the signal wiring 10 from being generated at both ends of the signal wiring 10, as illustrated in FIG. 4. Accordingly, an increase of the signal loss may be suppressed. When a stub having a length of, for example, several millimeters exists, the loss is increased even when the signal transmission is performed at the transmission speed of about 10 Gbps.

Therefore, when it is intended to perform the signal transmission at the transmission speed of 10 Gbps or more, the vias 13X, 13Y may be formed at both ends of the signal wiring 10 as illustrated in FIG. 1 and FIG. 2 in order not to allow a stub having a length of 1 mm or more to be generated. Further, for example, when it is intended to make signal transmission at a transmission speed of several tens of Gbps, the vias 13X, 13Y may be formed at both ends of the signal wiring 10 in order not to allow a stub having a length of several hundreds of pm to be generated.

In this case, two vias 13X, 13Y, each of which electrically connects both ends of the plurality of wirings 10, are formed, and at least one via 13 is formed between two vias 13X, 13Y such that the interval between the vias is an interval narrower than an interval by which the resonance is caused. In the meantime, the reason the configuration as describe above is adopted is as follows. That is, when the signal transmission is performed at a transmission speed higher than, for example, 10 Gbps, the signal loss in the package substrate is increased. Accordingly, the signal loss in the package substrate is required to be reduced in order to achieve further improvement of the transmission speed.

Further, the development of technology has made it possible to manufacture a large semiconductor chip and a length of the signal wiring is increased due to the increase of the size of the package substrate accompanied by the manufacturing of the large scale semiconductor chip. Also, when the signal wiring length is increased, the signal loss is also increased. From this stand point of view as well, the reduction of the signal loss in the package substrate is required. Here, it may be considered that materials having a lower dielectric constant or a lower dielectric loss tangent is used for the insulating layer in order to reduce the signal loss in the package substrate. However, when manufacturability or a manufacturing cost of the package substrate is taken into account, it is difficult to achieve further reduction of the signal loss by the method described above.

Further, it may also be considered that materials having higher conductivity are used for the signal wiring formed in the package substrate. However, copper is generally used as materials for the signal wiring, and materials having higher conductivity than copper almost do not exist. As a result, it may be regarded that materials better than copper do not exist when the cost is taken into account. Accordingly, it is difficult to achieve the reduction of the signal loss to a level that may be applicable to a product by merely changing the materials for the signal wiring.

Further, it has been generally known that the loss becomes smaller as the diameter of a cable becomes thicker (that is, as a central conductor becomes larger and a gap between a signal conductor and a ground conductor becomes wider) in, for example, a coaxial cable. Therefore, the same estimation may also be applied to the package substrate. That is, it is considered that the signal loss may be reduced by making the size of the signal wiring formed in the package substrate larger. However, even when the thickness of the signal wiring is made thicker in order to make the size of the signal wiring larger, there is a limitation on a thickness of a signal wiring capable of being manufactured.

Here, descriptions will be made on the limitation of the thickness of the signal wiring layer, specifically, by exemplifying some cases together. For example, in a case where the thickness of an insulating layer is 40 μm, the width of a signal wiring is 30 μm, and the thickness of the signal wiring is 5 μm, it is generally possible to manufacture the signal wiring having a relatively large thickness of the insulating layer and that becomes smaller towards the thickness direction. In contrast, for example, in a case where the thickness of the insulating layer is 10 μm, the width of the signal wiring is 20 μm, and the thickness of the signal wiring is 30 μm, it is difficult to manufacture the signal wiring which has a relatively small thickness of the insulating layer and becomes larger towards the thickness direction due to the reason that it is unable to cause an insulating material to uniformly enter a gap between the signal wiring layers. Further, when it is intended to be connected with the semiconductor chip, it is impossible to decrease the wiring density, but, when the width of the signal wiring is made wider in order to make the size of the signal wiring larger, the wiring density is decreased. Therefore, it is difficult to achieve the reduction of the signal loss even by the method described above.

As described above, since the manufacturing of the package substrate is restricted by various factors, such as for example, a cost, manufacturability, and a wiring density, it is difficult to achieve the reduction of the signal loss in the package substrate. Accordingly, in order to achieve the reduction of the signal loss in the package substrate, it is considered that the package substrate includes a signal line made of a plurality of wirings and including vias formed at both ends thereof, and includes a power supply layer or a ground layer formed above and below the signal wiring.

However, it has been found out that when the length of the signal wiring constituted by a plurality of wirings and including vias formed at both ends thereof is increased, the loss is increased more than the loss caused by a simple increase of the wiring length. By examining the causes of the increase of the loss, it has been found out that when the signal wiring is constituted by a plurality of wirings and including vias formed at both ends thereof, there is a case where the loss occurs due to the resonance depending on an interval (a length of signal wiring) between the vias or depending on a transmission speed (a frequency of transmission signal) such that the signal transmission is unable to be made.

That is, as described above, it has been found out that when the transmission speed is increased (when the frequency of the transmission signal becomes higher) or when the length of the signal wiring is increased, the loss due to the resonance occurs such that the signal transmission is unable to be made.

Accordingly, the configuration as described above has been adopted to make it possible to securely perform the signal transmission by preventing the occurrence of the loss due to the resonance even when the length of the signal wiring is increased or the transmission speed becomes higher, while achieving the reduction of the signal loss in the package substrate 1. The configuration as described above has been adopted to make it possible to securely perform the signal transmission by preventing the occurrence of the loss due to the resonance while achieving the reduction of the signal loss in the package substrate 1, for a case where the signal transmission is performed at a transmission speed higher than, for example, 10 Gbps, or for a case where the length of the signal wiring 10 is 1 cm or more.

Figure 5:
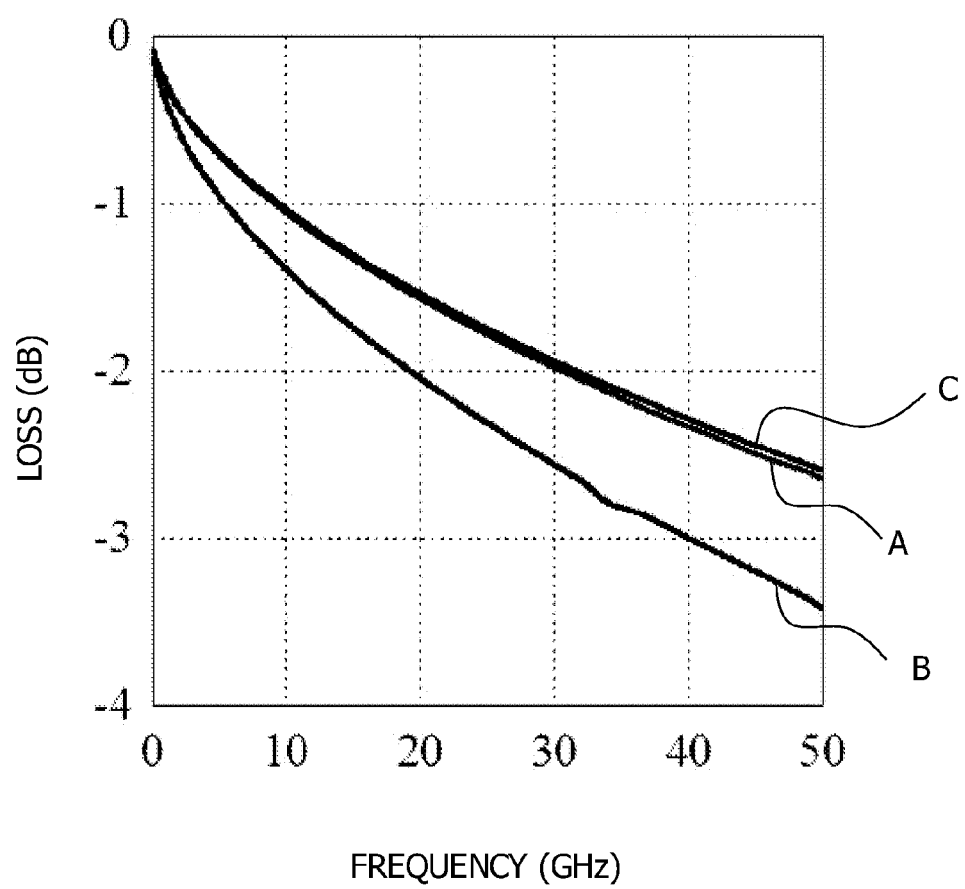
FIG. 5 is a graph representing the calculation results of a signal loss according to frequencies of transmission signals in a package substrate having the configuration of the circuit substrate according to the present embodiment, in a package substrate having a conventional strip line structure, and in a package substrate formed with a signal wiring having a thickness which makes it difficult to manufacture.

Here, FIG. 5 is a graph representing the calculation results of a signal loss according to the frequencies of transmission signals in the package substrate 1 formed with the signal wiring 10 having the structure according to the present embodiment, in a package substrate having a conventional strip line structure, and in a package substrate formed with a signal wiring having a thickness which makes it difficult to manufacture. Further, in FIG. 5, the solid line A represents the calculation results of the signal loss according to the frequency of the transmission signal in the package substrate 1 which includes the signal wiring 10 having a structure in which the wirings 10A, 10B corresponding to two layers of an upper layer and a lower layer are connected with each other through the plurality of vias 13.

Figure 6C:
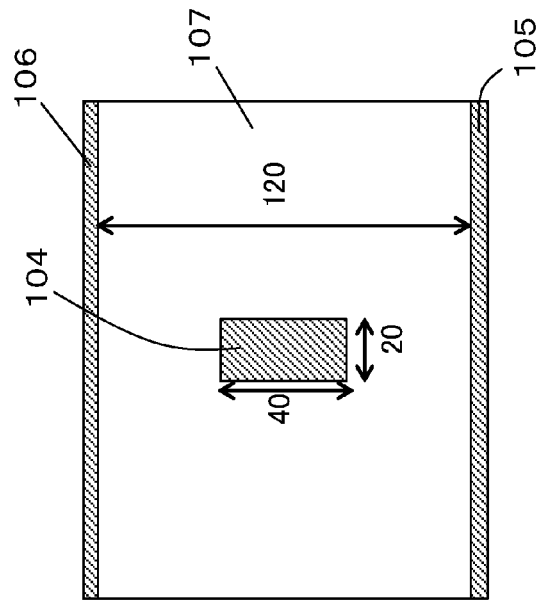
FIG. 6C is a schematic cross-sectional diagram illustrating dimensions of the package substrate formed with a signal wiring having a thickness which makes it difficult to manufacture.
Figure 6A:
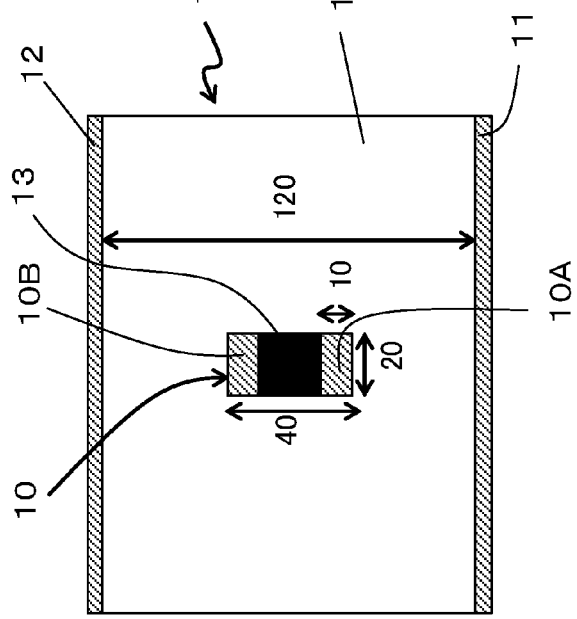
FIG. 6A is a schematic cross-sectional diagram illustrating dimensions of the package substrate having the configuration of the circuit substrate according to the present embodiment.

Here, as illustrated in FIG. 6A, the upper and lower wirings 10A, 10B are made of a copper wiring and each of the wirings 10A, 10B has a width of 20 μm, a thickness of 10 μm, and an entire thickness of the signal wiring 10, in which two layers of an upper layer and a lower layer of the wirings 10A, 10B are connected by the plurality of vias 13, is 40 μm. Further, the insulating layers 15, 16, and 17 between the upper and lower layers of the ground layers 11, 12 are made of resin insulating layers, and the thickness of the insulating layers 15, 16, and 17 is 120 μm and the relative permittivity thereof is 3. Further, the wiring length of the signal wiring 10 is 30 mm and the vias 13 are arranged at an equal interval of 500 μm which is an interval between the vias 13.

Figure 6B:
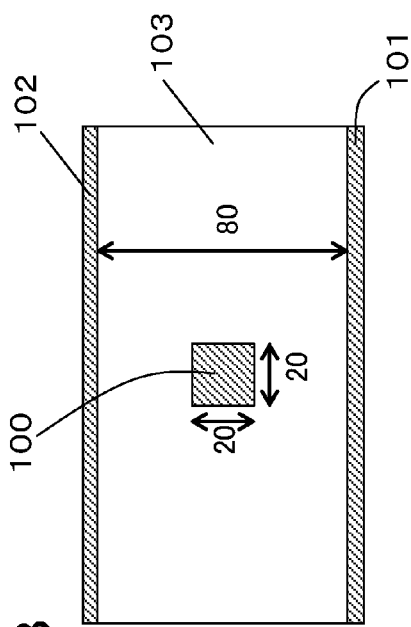
FIG. 6B is a schematic cross-sectional diagram illustrating dimensions of the package substrate having the conventional strip line structure.

Further, in FIG. 5, the solid line B represents the calculation results of the signal loss according to a package substrate having a conventional strip line structure. Here, as illustrated in FIG. 6B, a signal wiring 100 is made of a copper wiring and the signal wiring 100 has a width of 20 μm and a thickness of 20 μm, and an insulating layer 103 between the upper and lower layers of ground layers 101, 102 is made of a resin insulating layer, and the thickness of the insulating layer 103 is 80 μm and the relative permittivity thereof is 3. Further, the wiring length of the signal wiring 100 is 30 mm.

Further, in FIG. 5, the solid line C represents the calculation results of the signal loss according to the frequency of the transmission signal in each of the package substrates having a thickness which makes it difficult to manufacture. Here, as illustrated in FIG. 6C, a signal wiring 104 is made of a copper wiring and the signal wiring 100 has a width of 20 μm and a thickness of 40 μm, and the insulating layer 103 between the upper and lower layers of ground layers 105, 106 is made of a resin insulating layer, and the thickness of the insulating layer 103 is 120 μm and the relative permittivity thereof is 3. Further, the wiring length of the signal wiring 104 is 30 mm.

As illustrated by the solid lines A, B in FIG. 5, the signal loss (transmission loss) may be significantly reduced according to the package substrate 1 having the structure of the present embodiment, compared to the package substrate having the conventional strip line structure. Further, as illustrated by the solid lines A and C in FIG. 5, the signal loss according to the package substrate 1 is substantially the same as that of each of the package substrates which includes the signal wiring 104 having a thickness which makes it difficult to manufacture. That is, an electromagnetic field made by the transmission signal propagates almost only the surface of the signal wiring in the high frequency region (e.g., several tens of GHz).

Therefore, the loss caused by a package substrate which includes the signal wiring 10 having the structure in which two layers of the upper and lower layers of the wirings 10A, 10B are connected with each other through the vias 13 as in the present embodiment may also be the same as the loss caused by the package substrate which includes the signal wiring 104 having a thickness which makes it difficult to manufacture. Further, when the wiring length is increased, the loss is also increased accordingly. Further, when the frequency of the transmission signal becomes higher, the loss is also increased accordingly.

Further, when a special manufacturing method is utilized in order to manufacture the package substrate which includes the signal wiring 104 having a thickness which makes it difficult to manufacture, it leads to a significant increase in cost. In contrast, as described above, since the package substrate 1 having the structure according to the present embodiment may be manufactured with the same manufacturing precision by using a general manufacturing technology, the package substrate 1 may be manufactured without investing, for example, the manufacturing facility, that is, without causing the increase in cost.

Further, when it is intended to increase the width of the signal wiring to reduce the signal loss, the wiring density is decreased, whereas, according to the package substrate 1 having the structure of the present embodiment, the reduction of the signal loss may be achieved without causing the decrease of the wiring density. Further, FIG. 7 is a graph representing the calculation results of a signal loss according to the frequencies of transmission signals in the package substrate 1 formed with the signal wiring 10 having the structure of the present embodiment and in a package substrate formed with a signal wiring having a structure of a comparative example, respectively.

Figure 7:
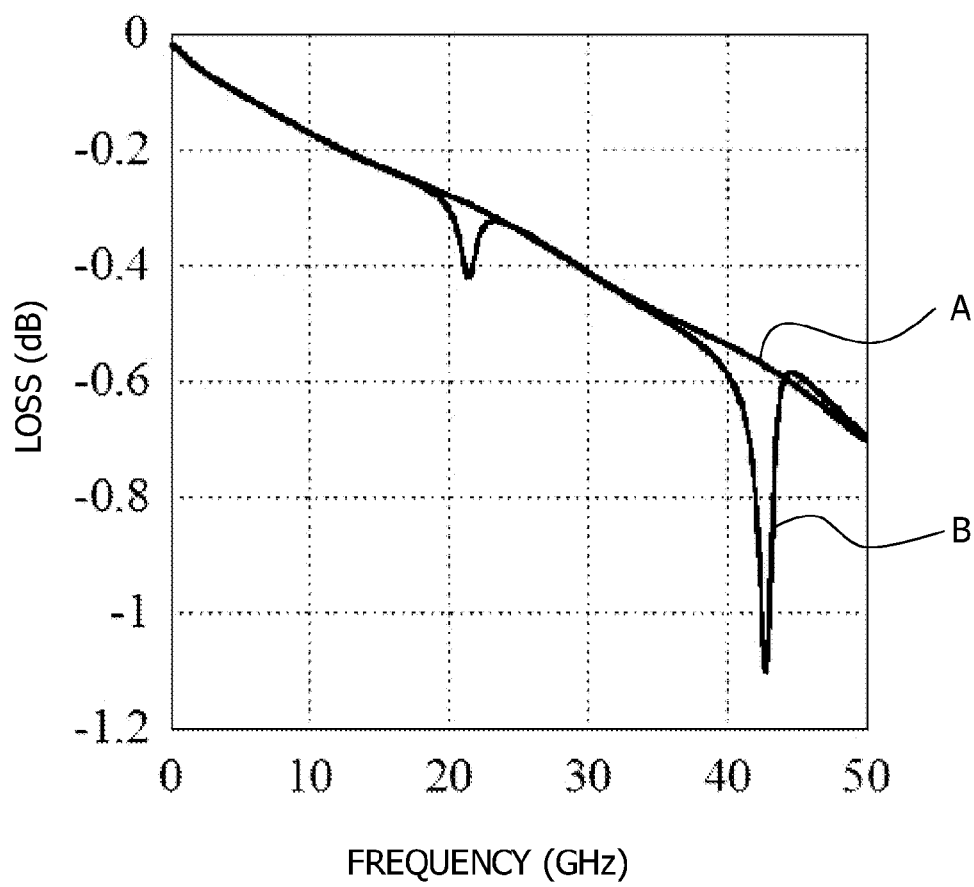
FIG. 7 is a graph representing the calculation results of a signal loss according to frequencies of transmission signals in the package substrate having the configuration of the circuit substrate according to the present embodiment and in a package substrate formed with a signal wiring having a structure of a comparative example.

Further, in FIG. 7, the solid line A represents the calculation results of the signal loss according to the frequency of the transmission signal in the package substrate 1 which includes the signal wiring 10 having a structure in which the wirings 10A, 10B corresponding to two layers of the upper layer and the lower layer of the present embodiment are connected with each other through the plurality of vias 13.

Here, as illustrated in FIG. 6A, the upper and lower wirings 10A, 10B are made of a copper wiring and each of wirings 10A, 10B has a width of 20 μm, a thickness of 10 μm, and an entire thickness of the signal wiring 10, in which two layers of the upper layer and the lower layer of wirings 10A, 10B are connected by the plurality of vias 13, is 40 μm (see, e.g., FIG. 6A). Further, the insulating layers 15, 16, and 17 between the upper and lower layers of the ground layers 11, 12 are made of resin insulating layers, and the thickness of the insulating layers 15, 16, and 17 is 120 μm and the relative permittivity thereof is 3. Further, the wiring length of the signal wiring 10 is 4 mm and the vias 13 are arranged at an equal interval of 500 μm which is an interval between the vias 13.

Further, in FIG. 7, the solid line B represents the calculation results of the signal loss according to the frequency of the transmission signal in the package substrate formed with the signal wiring having the structure in which only both ends of the wirings of two layers of the upper layer and the low layer are connected with each other through the vias. Here, the upper and lower wirings are the copper wirings similarly as in the present embodiment and each of the wirings has a width of 20 μm, a thickness of 10 μm, and an entire thickness of the signal wiring 10, in which two layers of the upper layer and the lower layer of wirings are connected by the plurality of vias 13, is 40 μm.

Further, the insulating layers between the upper and lower layers of the ground layers are made of resin insulating layers similarly as in the present embodiment, and the thickness of the insulating layers is 120 μm and the relative permittivity thereof is 3. Further, the wiring length of the signal wiring is 4 mm, and since the vias are formed only at both ends of the signal wiring, the interval between the vias corresponds to a value obtained by subtracting a size of two vias from the wiring length.

In FIG. 7, as illustrated by the solid line B, in the package substrate formed with the signal wiring having the structure in which only both ends of the wirings of two layers of the upper layer and the low layer of the comparative example are connected with each other through the via, the loss occurs due to the resonance at a portion in which the frequency of the transmission signal exceeds 20 GHz and another portion in which the frequency of the transmission signal exceeds 40 GHz. In contrast, in FIG. 7, as illustrated by the solid line A, in the package substrate 1 which includes the signal wiring 10 having a structure in which the wirings 10A, 10B corresponding to two layers of an upper layer and a lower layer of the present embodiment are connected with each other through the plurality of vias 13, the loss due to the resonance (e.g., the loss that increases only in the vicinity of a predetermined frequency due to the resonance; increase of loss due to the resonance) does not occur at a frequency region ranging from 0 GHz to 50 GHz portion. Further, when the wiring length is increased, the loss is also increased accordingly. Further, when the frequency of the transmission signal becomes higher, the loss is also increased accordingly.

As described above, the loss due to the resonance may not occur by narrowing the interval between the vias. That is, the plurality of vias 13 are formed at an interval narrower than the interval by which the resonance is caused, that is, the signal wiring 10 is separated by the vias 13 to make each wiring length shorter than the wiring length by which the resonance is caused, such that the loss due to the resonance may not occur. For example, as in the comparative example, when the wiring length is 4 mm and the interval between the vias is substantially the same as the wiring length, the package substrate 1 which includes the signal wiring 10 is used only for a case where the transmission signal having the frequency lower than 20 GHz is transmitted. In other words, in a case where the transmission signal having the frequency lower than 20 GHz is transmitted, when the interval between the vias is not shorter than 4 mm or so, it is unable to prevent the occurrence of the loss due to the resonance.

In contrast, as in the present embodiment, when the wiring length is 4 mm and the vias 13 are also formed between the vias 13X, 13Y of both ends of the signal wiring to make the interval between the vias 13 narrower to have a length of 500 μm or so, such that the package substrate 1 formed with the signal wiring 10 may also be used for a case where the transmission signal having the frequency of up to 50 GHz is transmitted. In other words, in a case where the transmission signal having the frequency of up to 50 GHz is transmitted, even though the wiring length of the signal wiring 10 is 4 mm, it is possible to prevent the occurrence of the loss caused by the resonance when the plurality of vias 13 are formed such that the interval between the vias 13 is 500 μm or so. Further, narrowing the interval between the vias 13 by forming the vias 13 between the vias 13X and 13Y of both ends of the signal wiring corresponds to separating the signal wiring 10 using the vias 13 in order to decrease the wiring length related to each resonance divided by the vias 13.

Specifically, the plurality of vias 13 may be formed to satisfy the following Equation 1 assuming that an interval between the vias 13 is P, the velocity of light is c, the frequency of the transmission signal is f, the relative permittivity of the insulating layer 16 formed between the plurality of wirings 10A, 10B is εr.

$$P < \frac{c}{2f\sqrt{\varepsilon_r}} \qquad \text{[Equation 1]}$$

That is, the interval between the plurality of vias 13 electrically connecting the plurality of wirings 10A, 10B with each other may be a value less than one half of a value obtained by dividing the velocity of light by the product of the frequency of the transmission signal and the square root of the relative permittivity of the insulating layer 16. Accordingly, the occurrence of the loss due to the resonance may be prevented. For example, when the relative permittivity εr of the insulating layer 16 formed between the plurality of wirings 10A, 10B is 4 and the frequency f of the transmission signal is 20 GHz, the velocity of light is calculated as c=2.998×10$^8$ (m/s) and thus, the right side of Equation 1 is calculated as follows:

$$(2.998 \times 10^8) \div (2 \times 20 \times 10^9 \times \sqrt{4}) = 3.748 \times 10^{-3} \text{(m)} = 3.748 \text{ (mm)}$$

Therefore, the plurality of vias 13 may be formed such that the interval (pitch) of the vias 13 is less than 3.748 (mm). Further, since the interval between the vias 13 may be less than this value, the interval between the vias is not required to be an equal interval and may be freely varied depending on, for example, the layout of the signal wiring 10.

In this case, the interval between the vias is made narrower by increasing the number of vias 13 as the frequency of the transmission signal becomes higher. Further, the number of vias 13 is increased as the wiring length of the signal wiring 10 is increased. For example, when the signal wiring has a wiring length of tens of millimeters and the transmission signal having the frequency of tens of Gbps is transmitted, it is also required to form the vias 13 between the vias 13X, 13Y of both ends of the signal wiring to narrow the interval between the vias 13.

As described above, the plurality of vias 13 are formed at an interval narrower than an interval by which the resonance is caused according to the frequency of the transmission signal and the wiring length of the signal wiring 10, that is, the signal wiring 10 is separated by the vias 13 to make each wiring length shorter than the length by which the resonance occurs. As a result, the occurrence of the loss by the resonance may be prevented. Accordingly, the circuit substrate and the electronic device according to the present embodiment have an advantage that the occurrence of the loss by the resonance may be prevented to securely perform the signal transmission, for example, even when the length of the signal wiring 10 is increased or the frequency of the transmission signal becomes higher.

Also, the package substrate 1 having the wiring structure according to the present embodiment may be applied to a package substrate used for transmitting a high frequency signal having a frequency of, for example, 10 GHz or more. That is, the package substrate 1 may be applied to a package substrate used for transmitting the signal at the transmission speed of 20 Gbps (e.g., transmission speed of tens of Gbps).

Further, the package substrate 1 having the wiring structure as described above may be applied to a package substrate formed with the signal wiring having the wiring length of, for example, 1 cm or more. The package substrate 1 may be applied to the package substrate having the wiring structure as described above such that the occurrence of loss due to the resonance is prevented while achieving the reduction of the signal loss in the package substrate, thereby making it possible to securely perform the signal transmission.

Figure 8:
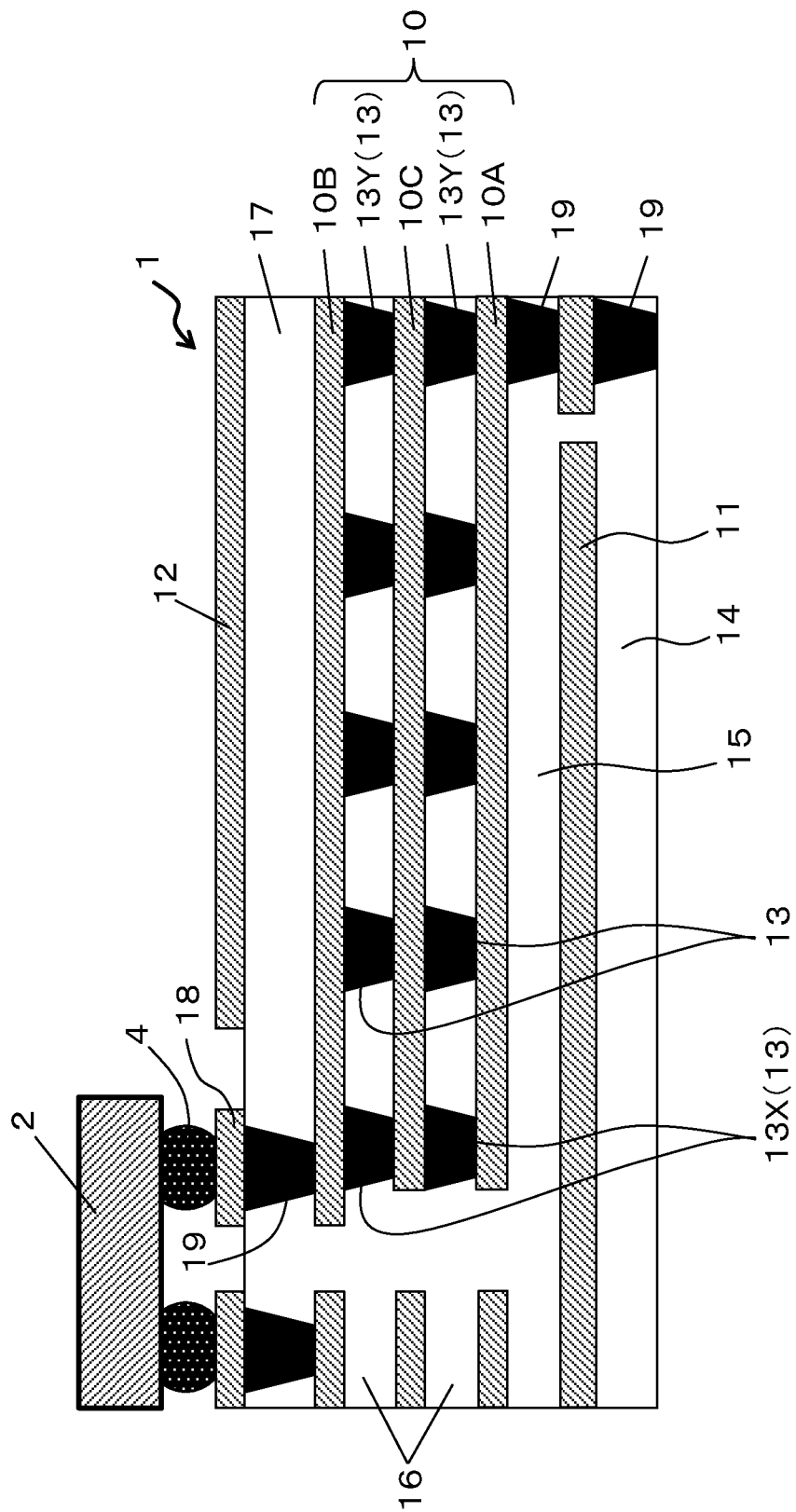
FIG. 8 is a schematic cross-sectional diagram illustrating a configuration of a modified example of the circuit substrate according to the present embodiment.

Further, the present disclosure is not limited to the configuration set forth in the embodiments described above and various modifications may be made without departing from the gist of the present disclosure. For example, in the embodiment described above, the signal wiring 10 is configured by two wirings of the lower wiring 10A and the upper wiring 10B, but is not limited thereto, and the signal wiring may be configured by three wirings or more. For example, as illustrated in FIG. 8, the signal wiring 10 may be configured by three wirings of the lower wiring 10A, an intermediate wiring 10C, and the upper wiring 10B.

In this case, the lower wiring 10A and the intermediate wiring 10C are electrically connected with each other by the plurality of vias 13 formed at an interval narrower than an interval by which a resonance is caused. Further, the intermediate wiring 10C and the upper wiring 10B are electrically connected with each other by the plurality of vias 13 formed at an interval narrower than an interval by which a resonance is caused. Accordingly, it becomes possible to cope with the increase of loss due to the increase of the size of the package substrate 1 (e.g., an increase of the wiring length) or the increase of the transmission speed (that is, an increase of a frequency of the transmission signal).

Figure 9:
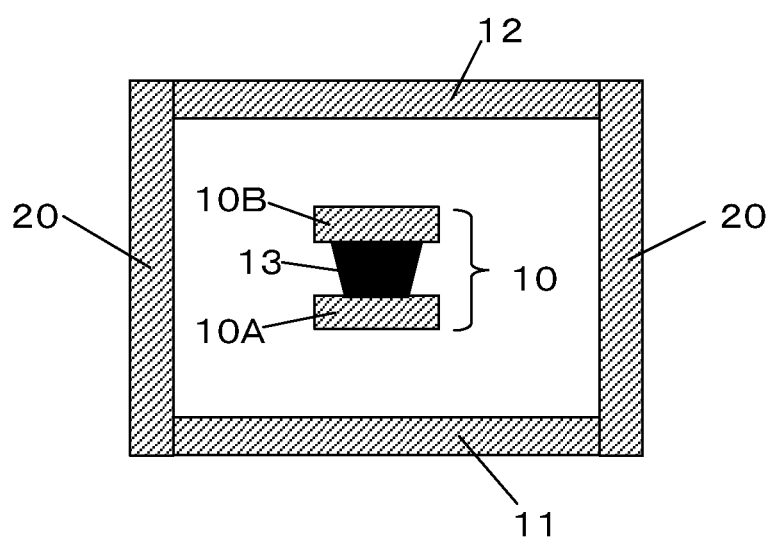
FIG. 9 is a schematic cross-sectional diagram illustrating a configuration of another modified example of the circuit substrate according to the present embodiment.

Further, for example, in the embodiment described above, a structure in which the ground layers (or the power supply layers) are formed above and below the signal wiring 10 is illustrated by way of an example, but the present disclosure is not limited thereto. For example, as illustrated in FIG. 9, the ground layers (or power supply layers) 20 may be formed at both sides of the signal wiring 10 as well as above and below the signal wiring 10. That is, a structure may be adopted in which the signal wiring 10 is surrounded by the ground layers (or the power supply layers) 11, 12, and 20. As described above, the ground layer may be formed at least above and below the signal wiring 10.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A circuit substrate comprising:
  a plurality of signal wirings formed at different positions of the circuit substrate in a thickness direction and extending in parallel in the circuit substrate; and
  ground layers or power supply layers formed at both sides of the circuit substrate in the thickness direction by interposing the plurality of the signal wirings between the ground layers or between the power supply layers,
  wherein the plurality of signal wirings are electrically coupled with each other by a plurality of conductors formed at an interval narrower than an interval by which a resonance is caused.

2. The circuit substrate according to claim 1, wherein the plurality of conductors includes two conductors that electrically couple both ends of the plurality of wirings, respectively.

3. The circuit substrate according to claim 1, wherein the plurality of conductor are prescribed by the following Equation 1 assuming that an interval between the conductors is P, the velocity of light is c, a frequency of a transmission signal is f, and a relative permittivity of an insulating layer formed between the plurality of wirings is $\epsilon_r$ $$P < \frac{c}{2f\sqrt{\epsilon_r}}. \qquad \text{[Equation 1]}$$

4. An electronic device comprising:
  a circuit substrate; and
  a semiconductor chip electrically coupled to the circuit substrate,
  wherein the circuit substrate includes;
  a plurality of signal wirings formed at different positions of the circuit substrate in a thickness direction and extending in parallel in the circuit substrate; and
  ground layers or power supply layers formed at both sides of the circuit substrate in the thickness direction by interposing the plurality of the signal wirings between the ground layers or between the power supply layers, and wherein the plurality of signal wirings are electrically coupled with each other by a plurality of conductors formed at an interval narrower than an interval by which a resonance is caused.

5. The electronic device according to claim 4, wherein the plurality of conductors includes two conductors that electrically couple both ends of the plurality of wirings, respectively.

6. The electronic device according to claim 4, wherein the plurality of conductors are prescribed by the following Equation 1 assuming that an interval between the conductors is P, the velocity of light is c, a frequency of a transmission signal is f, a relative permittivity of an insulating layer formed between the plurality of wirings is ϵr $$P < \frac{c}{2f\sqrt{\varepsilon_r}}.$$ [Equation 1]

\* \* \* \* \*